US012795881B2

(12) United States Patent
Mehrotra

(10) Patent No.: US 12,795,881 B2
(45) Date of Patent: Nov. 10, 2026

(54) SELECTIVE SILICON-GERMANIUM PROCESS AND STRUCTURE

(71) Applicant: TEXAS INSTRUMENTS INCORPORATED, Dallas, TX (US)

(72) Inventor: Manoj Mehrotra, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 379 days.

(21) Appl. No.: 18/498,559

(22) Filed: Oct. 31, 2023

(65) Prior Publication Data

US 2025/0142800 A1 May 1, 2025

(51) Int. Cl.
*H10B 10/00* (2023.01)

(52) U.S. Cl.
CPC ............. *H10B 10/12* (2023.02); *H10B 10/18* (2023.02)

(58) Field of Classification Search
CPC ................................ H10B 10/12; H10B 10/18
See application file for complete search history.

(56) References Cited

U.S. PATENT DOCUMENTS 7,642,607 B2 * 1/2010 Wang .................. H10D 84/017 257/E21.619
7,646,068 B2 * 1/2010 Ko ........................ H10P 30/204 257/536
10,158,017 B2 * 12/2018 Lee ...................... H10D 30/797
10,163,912 B2 * 12/2018 Lin ........................ H10B 10/12
2013/0193521 A1 * 8/2013 Lee ........................ H10B 10/00 257/369
2016/0133748 A1 * 5/2016 Kang .................. H10D 30/797 438/285
2017/0221906 A1 * 8/2017 Lin ........................ H10B 10/12
2017/0373189 A1 * 12/2017 Lee ...................... H10D 30/797

* cited by examiner

*Primary Examiner* — J. E. Schoenholtz
(74) *Attorney, Agent, or Firm* — Yudong Kim; Charles F. Koch

(57) ABSTRACT

Described examples include a semiconductor device having a first p-channel field effect transistor (p-FET). The first p-FET includes: a first gate dielectric layer on a surface of a substrate; a first gate structure on the first gate dielectric layer; and first silicon-germanium (SiGe) regions disposed in the substrate, on both sides of the first gate structure, the first SiGe regions extended to a first depth from the surface of the substrate. The semiconductor device also has a second p-FET. The second p-FET includes a second gate dielectric layer on the surface of the substrate; a second gate structure on the second gate dielectric layer; and second SiGe regions disposed in the substrate, on both sides of the second gate structure, the second SiGe regions extended to a second depth from the surface of the substrate, the second depth different than the first depth.

25 Claims, 19 Drawing Sheets

SELECTIVE SILICON-GERMANIUM PROCESS AND STRUCTURE

TECHNICAL FIELD

This relates generally to semiconductor structures and processing, and more particularly to silicon-germanium (SiGe) structures and processing.

BACKGROUND

Silicon-germanium (SiGe) structures have proven useful to improve the operational speed of devices in silicon semiconductor integrated circuits. This is particularly true for p-type transistors because the lattice strain between the silicon and germanium makes carrier holes in the semiconductor more mobile. However, adding SiGe structures adds significant process complexity. It is desirable to provide SiGe processes and structures that mitigate process complexity.

SUMMARY

In accordance with an example, a semiconductor device includes a first p-channel field effect transistor (p-FET). The first p-FET includes a first gate dielectric layer on a surface of a substrate; a first gate structure on the first gate dielectric layer; and first silicon-germanium (SiGe) regions disposed in the substrate, on both sides of the first gate structure, the first SiGe regions extended to a first depth from the surface of the substrate. The semiconductor device also includes a second p-FET. The second p-FET includes a second gate dielectric layer on the surface of the substrate; a second gate structure on the second gate dielectric layer; and second SiGe regions disposed in the substrate, on both sides of the second gate structure, the second SiGe regions extended to a second depth from the surface of the substrate, the second depth different than the first depth.

DETAILED DESCRIPTION

Figure 1:
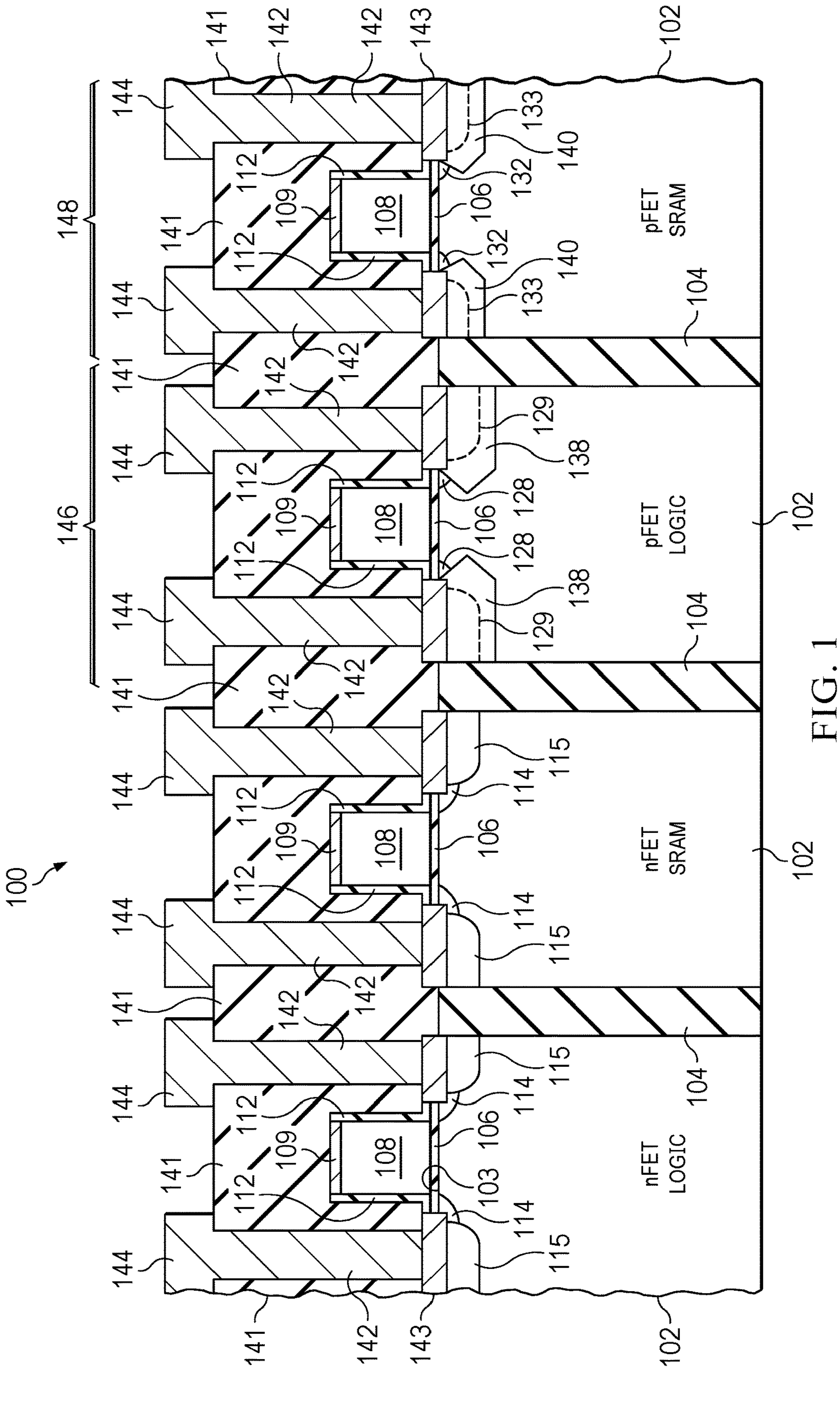
FIG. 1 is a side view of an example integrated circuit.

In the drawings, corresponding numerals and symbols generally refer to corresponding parts unless otherwise indicated. The drawings are not necessarily drawn to scale.

In this description, the term "coupled" may include connections made with intervening elements, and additional elements and various connections may exist between any elements that are "coupled." Also, as used herein, the terms "on" and "over" may include layers or other elements where intervening or additional elements are between an element and the element that it is "on" or "over."

FIG. 1 is a side view of an example integrated circuit 100. Isolation regions 104 divide substrate 102 into four regions in this illustration although the present disclosure is not limited thereto. For example, substrate 102 may include less than four regions (e.g., two or three regions) or greater than four regions (e.g., five, six, or even more regions). Substrate 102 has a surface 103. The four regions may have different example device types. In most circuits, these four types would not necessarily be beside each other. However, most transistors will have an isolation structure to isolate it from other devices in the integrated circuit.

The four types of devices illustrated are n-type field effect transistor (n-FET) for logic operations (denoted as "nFET Logic"), n-FET for static random-access memory (SRAM) (denoted as "nFET SRAM"), p-type field effect transistor (p-FET) for logic operations (denoted as "pFET Logic"), and p-FET for SRAM (denoted as "pFET SRAM"). Logic and SRAM devices are indicated because of their differing characteristics. For example, the speed of logic devices is more important than avoiding leakage issues. SRAM devices may spend a great deal of time in one state, during which a leakage problem risks random data flips. Therefore, the requirements for SRAM devices are low leakage with less emphasis on speed.

Each transistor in FIG. 1 includes a gate 108, a gate silicide 109, and sidewall spacers 112. The n-FETs include lightly doped drain (LDD) regions 114 and source/drain regions 115 that are n-type. Each transistor also includes a gate dielectric 106 at the surface 103 of the substrate 102. P-FET structure 146 includes silicon-germanium (SiGe) regions 138 and lightly doped drain (LDD) regions 128. The p-FET structure 146 also includes source/drain regions 129 (shown as dotted lines). The source/drain regions 129 may be formed in the SiGe regions 138 as depicted in FIG. 1, and the SiGe regions 138 and the source/drain regions 129 therein may be collectively referred to as SiGe source/drain regions. Similarly, p-FET structure 148 includes SiGe regions 140 and LDD regions 132. The p-FET structure 148 also includes source/drain regions 133 (shown as dotted lines). The SiGe regions 140 and the source/drain regions 133 therein may collectively referred to as SiGe source/drain regions.

Although the source/drain regions 129, 133 are described to present with the SiGe regions 138, 140, respectively, the present disclosure is not limited thereto. For example, the source/drain regions 129 may extend further into the substrate 102 than the SiGe regions 138—e.g., the source/drain regions 129 extending past the bottom interface between the SiGe regions 138 and the substrate 102. Similarly, in some examples, the source/drain regions 133 may extend further into the substrate 102 than the SiGe regions 140—e.g., the source/drain regions 133 extending past the bottom interface between the SiGe regions 140 and the substrate 102.

Respective SiGe regions 138 and SiGe regions 140 increase the mobility of holes in the corresponding channel regions (between LDD regions under the gate 108) of the P-FET structures 146 and 148, thus increasing the speed of the majority carrier of p-type devices. Of note, in this example, SiGe regions 140 extend less into the substrate 102 than SiGe regions 138. Also, the SiGe regions 140 protrude above the surface 103 of the substrate 102 while top surfaces of the SiGe regions 138 are substantially flush with the surface 103. Moreover, the source/drain regions 133 extend less into the substrate 102 than the source/drain regions 129. The relatively shallower source/drain regions 133 may advantageously lower the chance of leakage in the p-FET structure 148 than the p-FET structure 146. Also, the relatively deeper SiGe regions 138 may increase the speed of the p-FET structure 146 than the p-FET structure 148.

Interlevel dielectric 141 protects all of the transistors. Source/drain contacts 144 extend through openings 142 in interlevel dielectric 141 to provide electrical coupling to their respective source/drain regions at silicide regions 143. Similar contacts (not shown) are provided to portions of gates 108 that extend into or out of the page to provide contacts to gates 108 at the gate silicide 109.

Figure 2A:
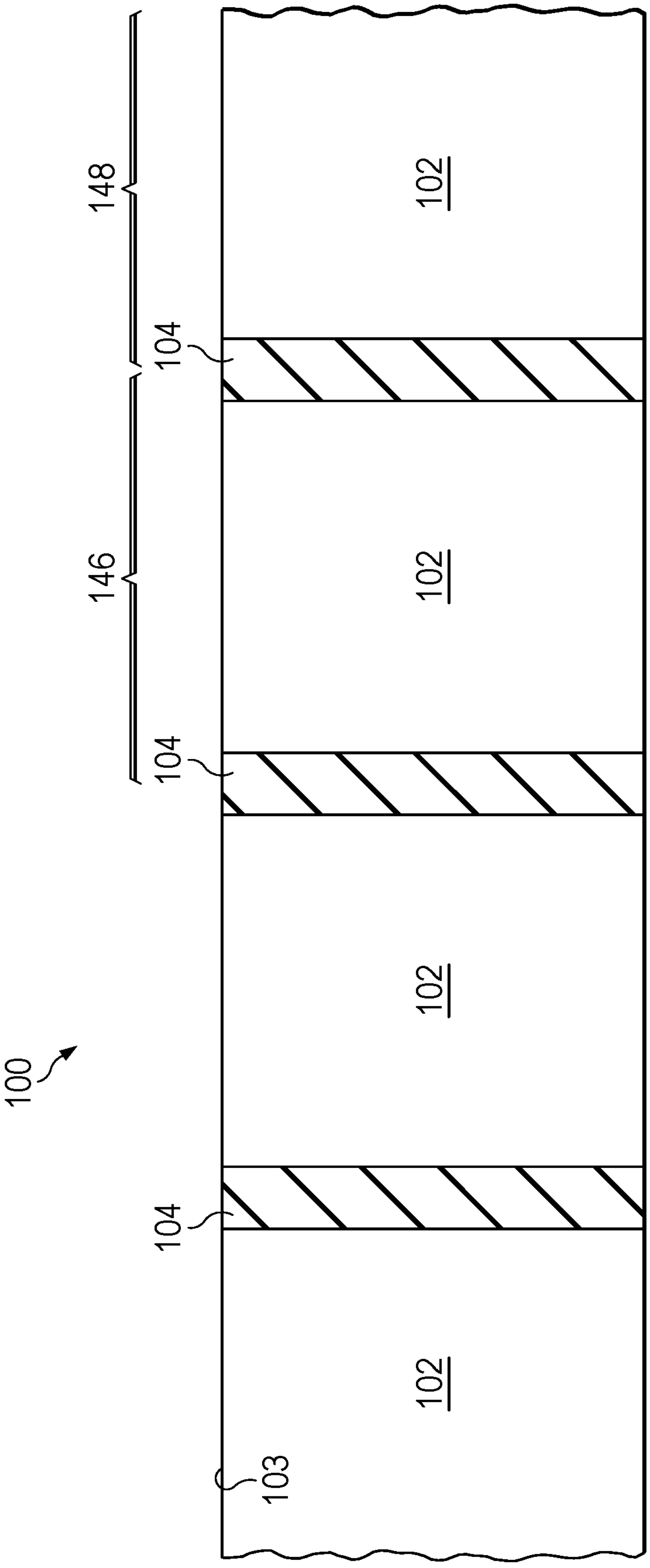
FIGS. 2A-O (collectively "FIG. 2") are side view drawings illustrating an example process.

FIGS. 2A-20 (collectively "FIG. 2") are side view drawings illustrating an example process for making integrated circuit 100. FIG. 2A shows substrate 102 with a surface 103 (e.g., top surface). FIG. 2A also shows isolation regions 104 formed by etching trenches in substrate 102 and filling the trenches with dielectric material or polysilicon with a liner of dielectric material.

Figure 2B:
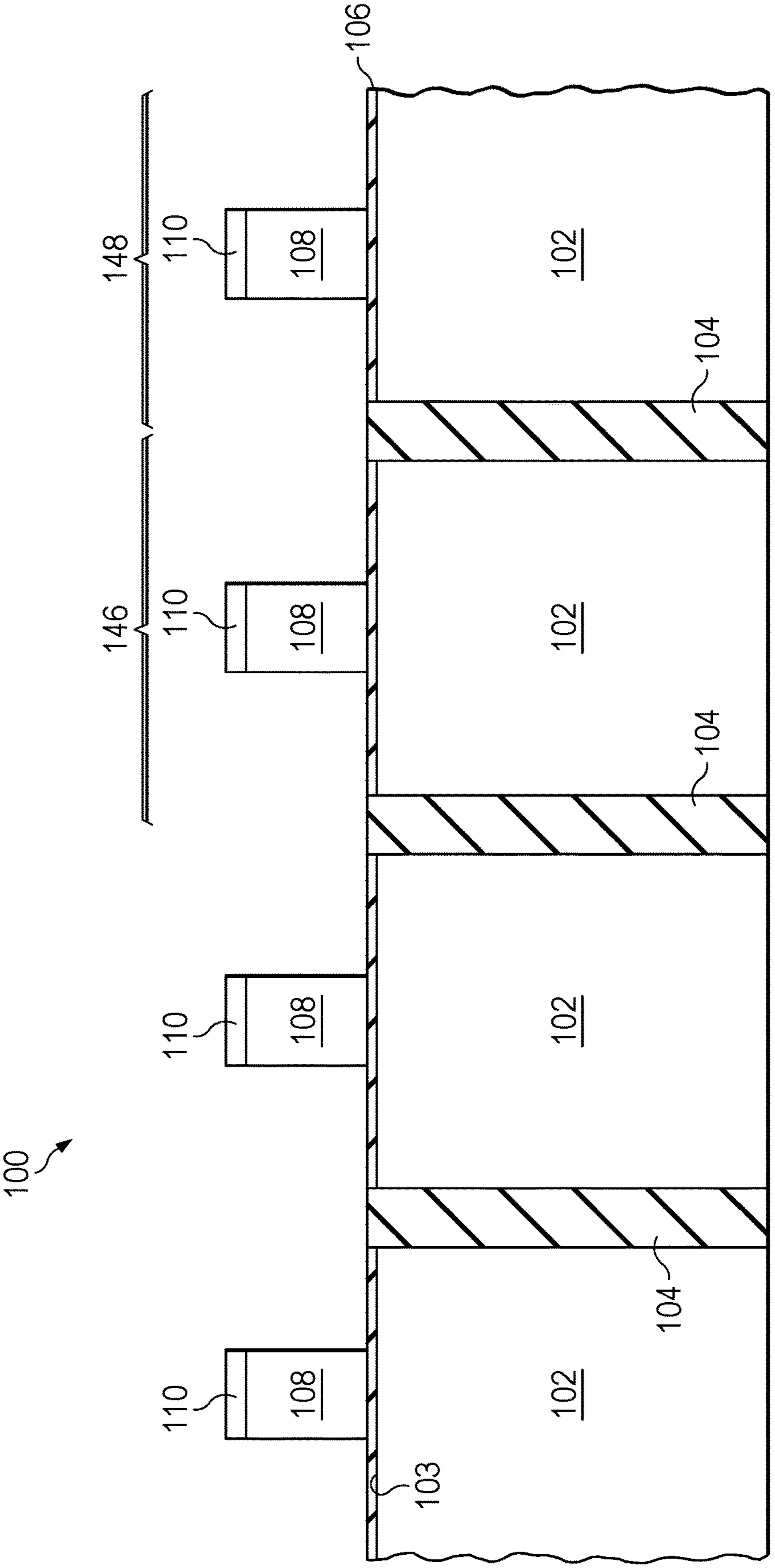

Gate oxide layer 106 is then formed at the surface 103 as shown in FIG. 2B. In an example, the gate oxide layer 106 may be formed using thermal oxidation. In another example, gate oxide layer is a high-K dielectric material having a dielectric constant greater than silicon dioxide such as hafnium silicate, zirconium silicate, hafnium dioxide, and zirconium dioxide. Such high-K dielectric materials may be deposited using atomic layer deposition to a thickness of 3-8 nm. A layer of polysilicon is then deposited to a thickness of 100-300 nm by chemical vapor deposition (CVD) of silane, for example. A cap layer is formed on the layer of polysilicon. In some examples, the cap layer includes silicon nitride, silicon oxide, silicon oxynitride, or a combination thereof. These layers are etched (e.g., using a photoresist mask) to form gates 108 and gate caps 110 as shown in FIG. 2B.

Figure 2C:
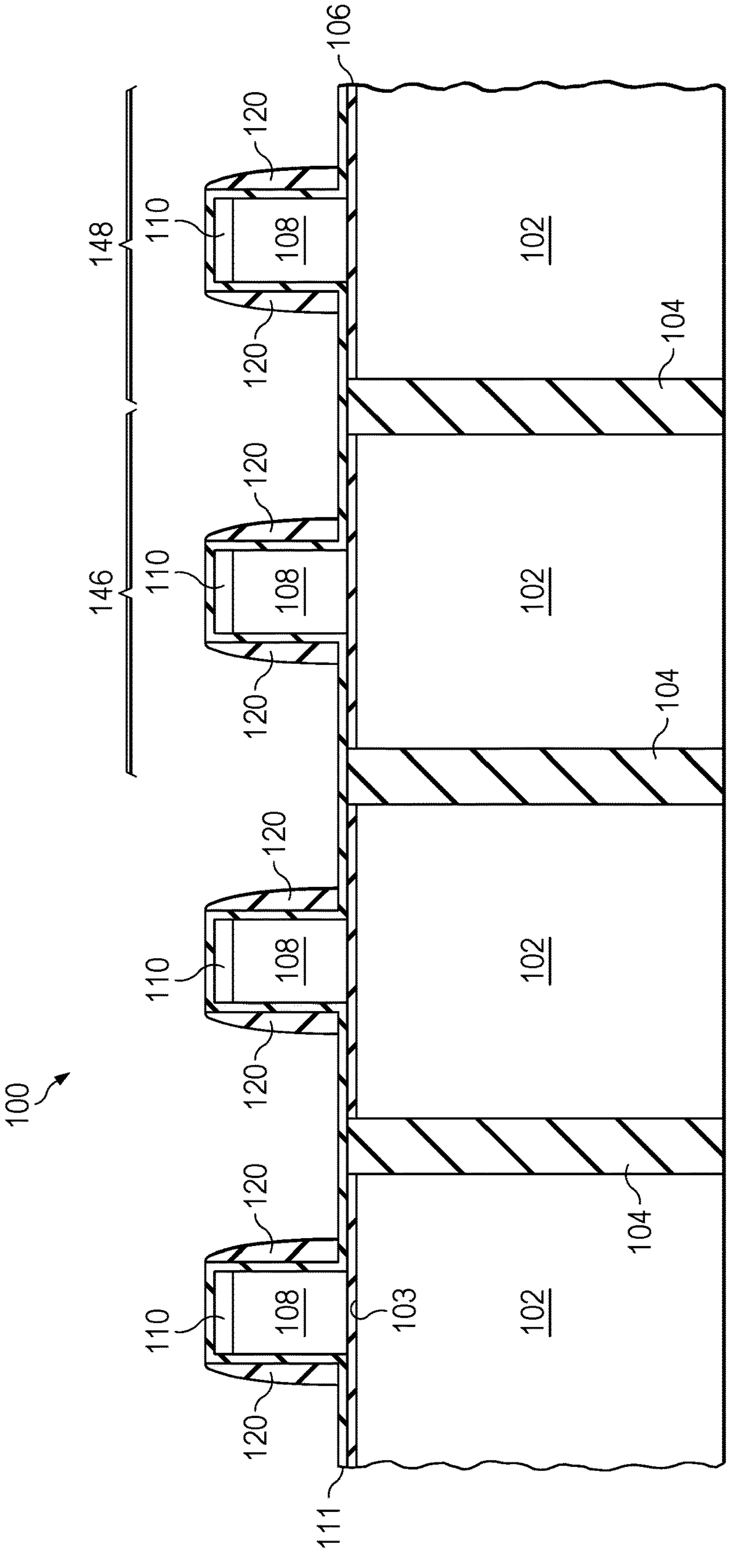

A dielectric layer 111 of one or more dielectric materials is then deposited (e.g., using conformal CVD process) to a thickness of 1-5 nm as shown in FIG. 2C. The dielectric layer 111 may include silicon nitride, silicon oxide, or a combination thereof. Subsequently, a layer of silicon nitride/oxynitride deposited (e.g., using a CVD process) to a thickness of 10-50 nm. This layer of silicon nitride/oxynitride is then anisotropically etched to form spacers 120 as shown in FIG. 2C.

Figure 2D:
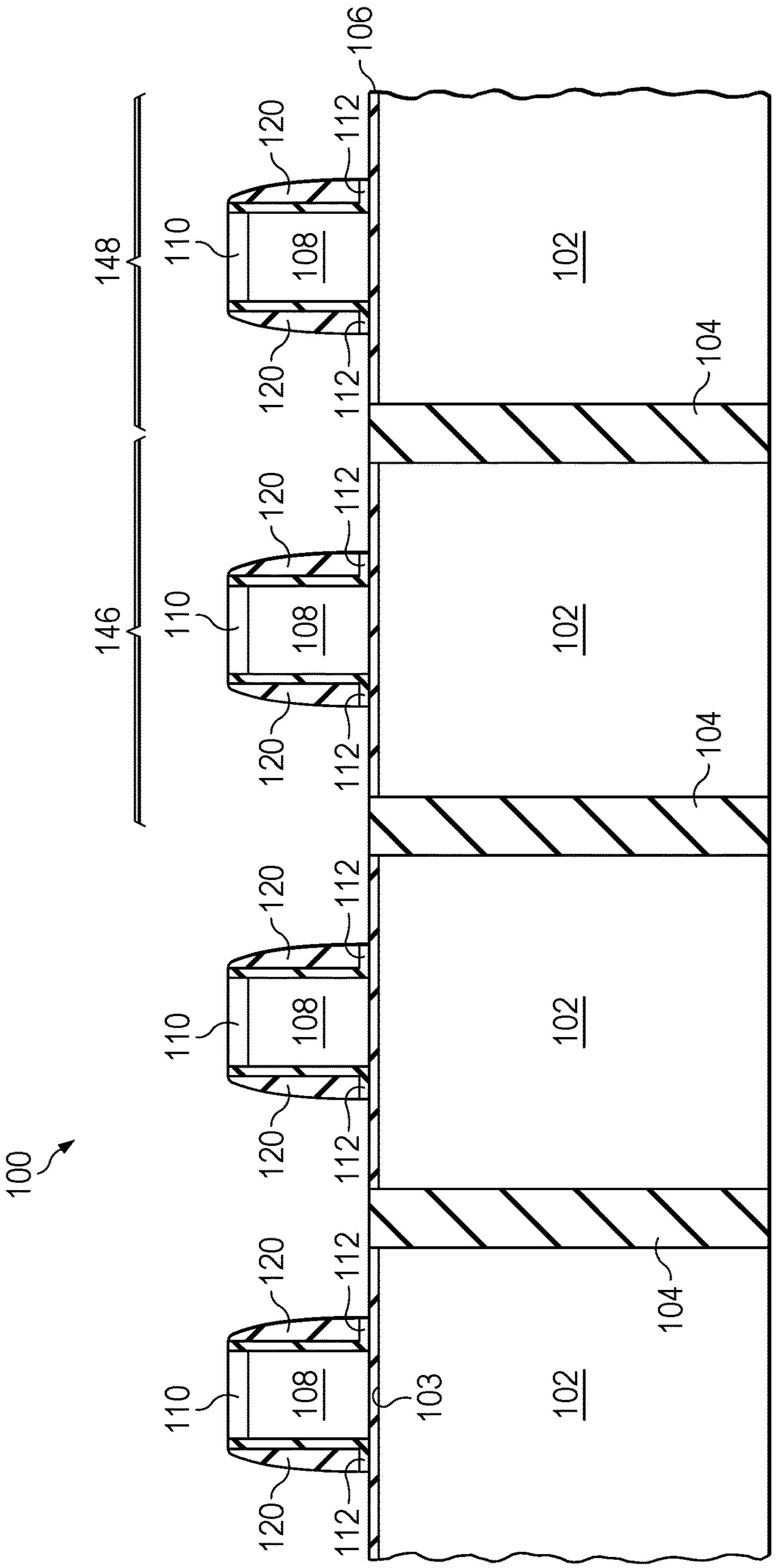

The dielectric layer 111 is then etched to form the sidewall spacers 112 on sidewalls of the gates 108. In other words, portions of the dielectric layer 111 between gates 108 (e.g., portions of the dielectric layer 111 uncovered by the spacers 120) are removed as shown in FIG. 2D. In some examples, this etch will also remove the dielectric layer 111 on top of gate caps 110 as shown in FIG. 2D. In some examples, this etch will thin the dielectric layer 111 on top of gate caps 110 but may not remove it entirely (although FIG. 2D does not explicitly show the thinned dielectric layer 111 on top of gate caps 110).

Figure 2E:
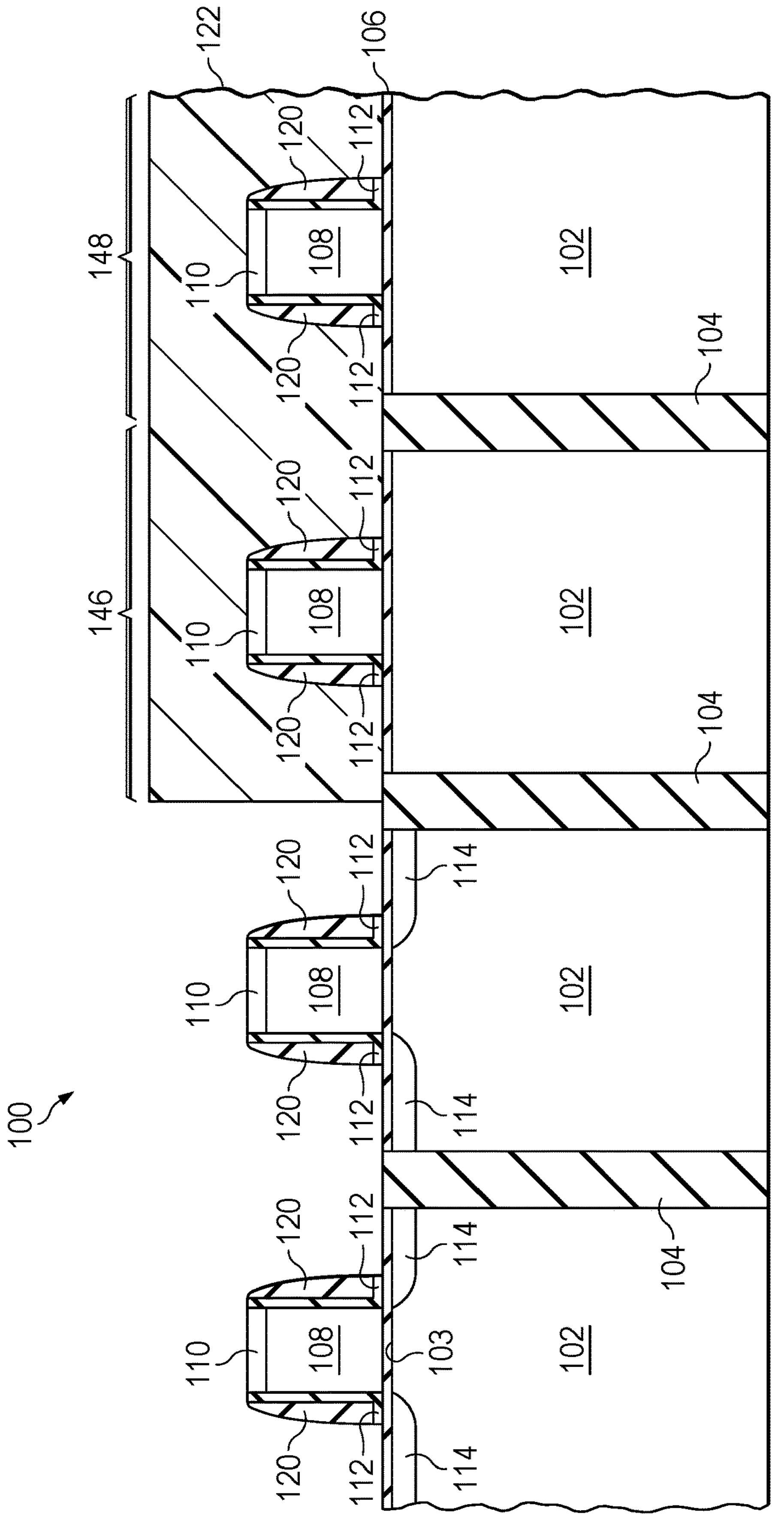

Photoresist mask 122 is then formed as shown in FIG. 2E. An ion implant process of n-type dopant atoms (e.g., phosphorus and arsenic) is then performed. For example, an implant of arsenic having an energy of 0.5 to 3 keV and a dose of $1\times10^{14}$ to $1\times10^{16}$ atoms/cm$^2$, which may include other halo implants such as boron or $BF_2$ with energies of 2 to 40 keV and doses of $1\times10^{13}$ to $1\times10^{14}$, depending on the species and other co-implants. An anneal may follow to form LDD regions 114.

Figure 2F:
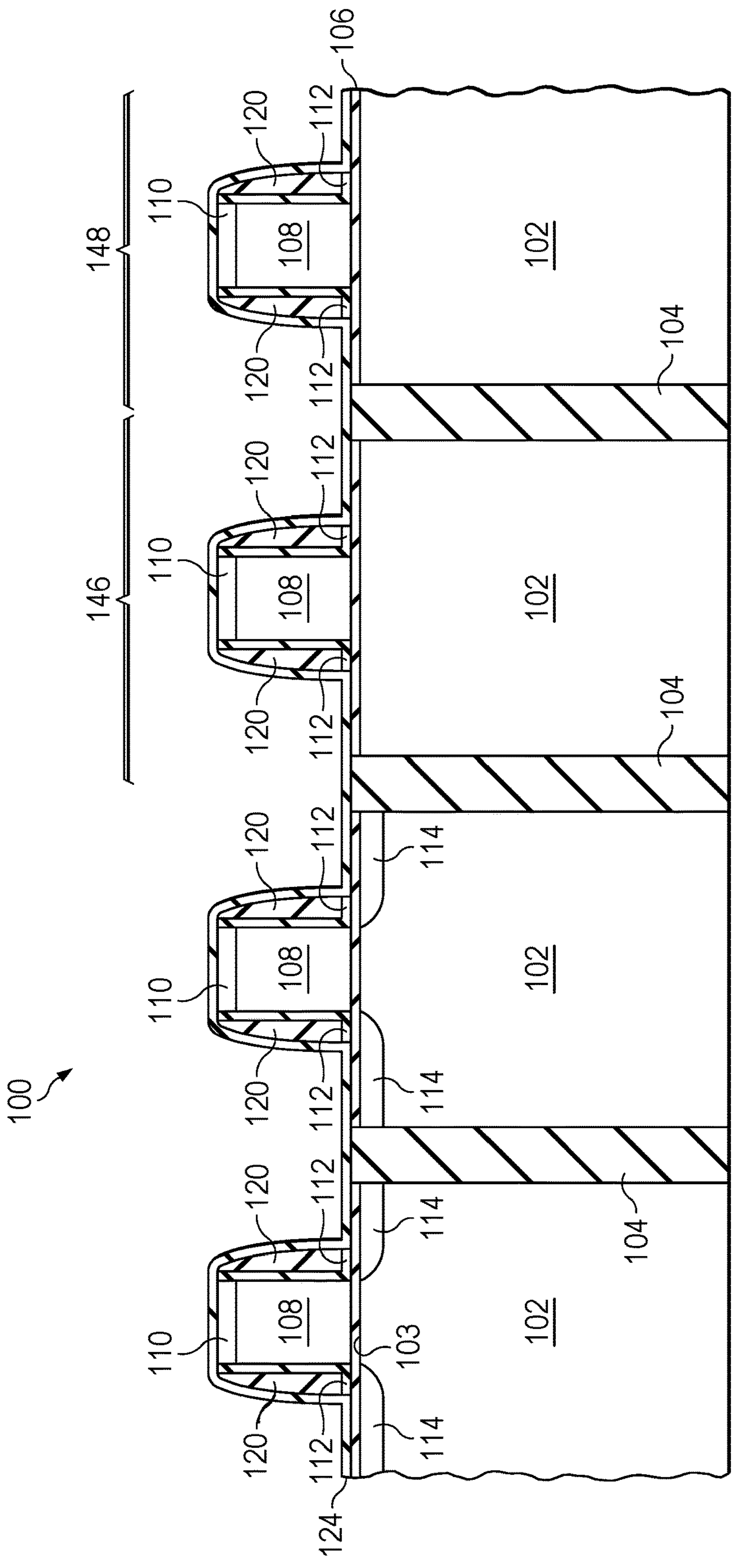

A hard mask 124 is then deposited (e.g., using a CVD process) to a thickness of 10-50 nm as shown in FIG. 2F. Hard mask 124 includes silicon nitride in this example to allow for differential etching of silicon dioxide and silicon as is further explained hereinbelow.

Figure 2G:
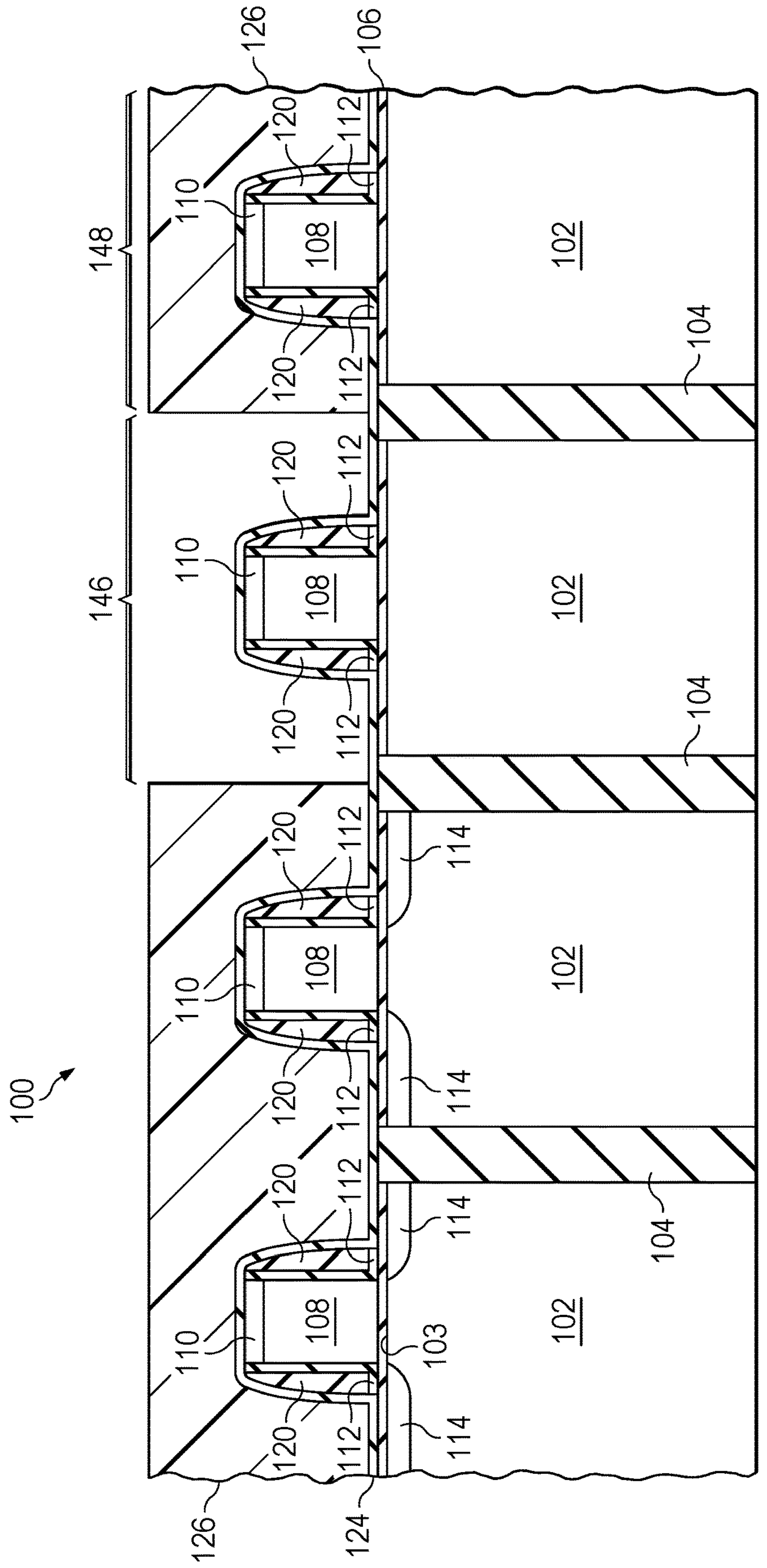
Figure 2H:
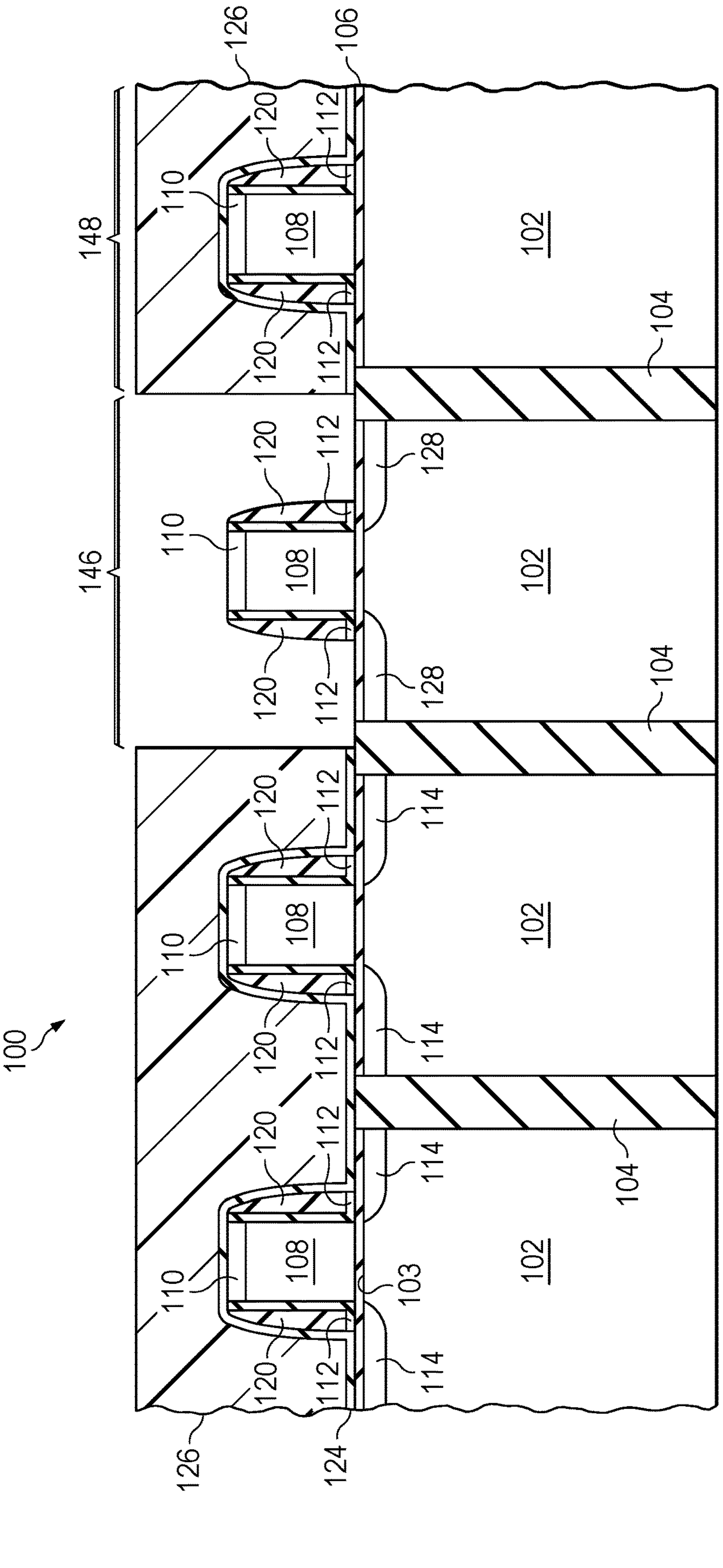

FIG. 2G shows the formation of patterned photoresist mask 126 (e.g., using a photolithography process), which covers all sections except where p-FET structure 146 will be formed. Photoresist mask 126 is then used during an etch process to etch away the exposed portion of hard mask 124 as shown in FIG. 2H. An etchant such as sulfur hexafluoride is used for selectivity to silicon nitride of the hard mask 124 (e.g., preferentially removing silicon nitride compared to other materials). As is further explained herein below, hard mask 124 may be completely or partially removed depending on the desired depth of the resulting SiGe regions in p-FET structure 146. In this example process flow of forming the relatively deeper SiGe regions in p-FET structure 146 than p-FET structure 148, the hard mask 124 over p-FET structure 146 may be completely removed or may be thinned to have a less thickness remaining than p-FET structure 148 (as described with reference to FIG. 2I). In addition, an ion implant process of boron or $BF_2$ having an energy of 2 to 10 keV and a dose of $1\times10^{14}$ to $1\times10^{16}$ atoms/cm$^2$ is performed to form LDD regions 128. This ion implant process may also include halo implants of phosphorus and/or arsenic with an energy of 5 to 30 keV and a dose of $1\times10^{14}$ to $1\times10^{15}$ depending on the species and other co-implanted species. The ion implant process may be done before etching the hard mask 124 or after at least partially etching the hard mask 124 depending on desired electrical characteristics of the p-FET structure 146. Subsequently, the photoresist mask 126 is removed.

Figure 2I:
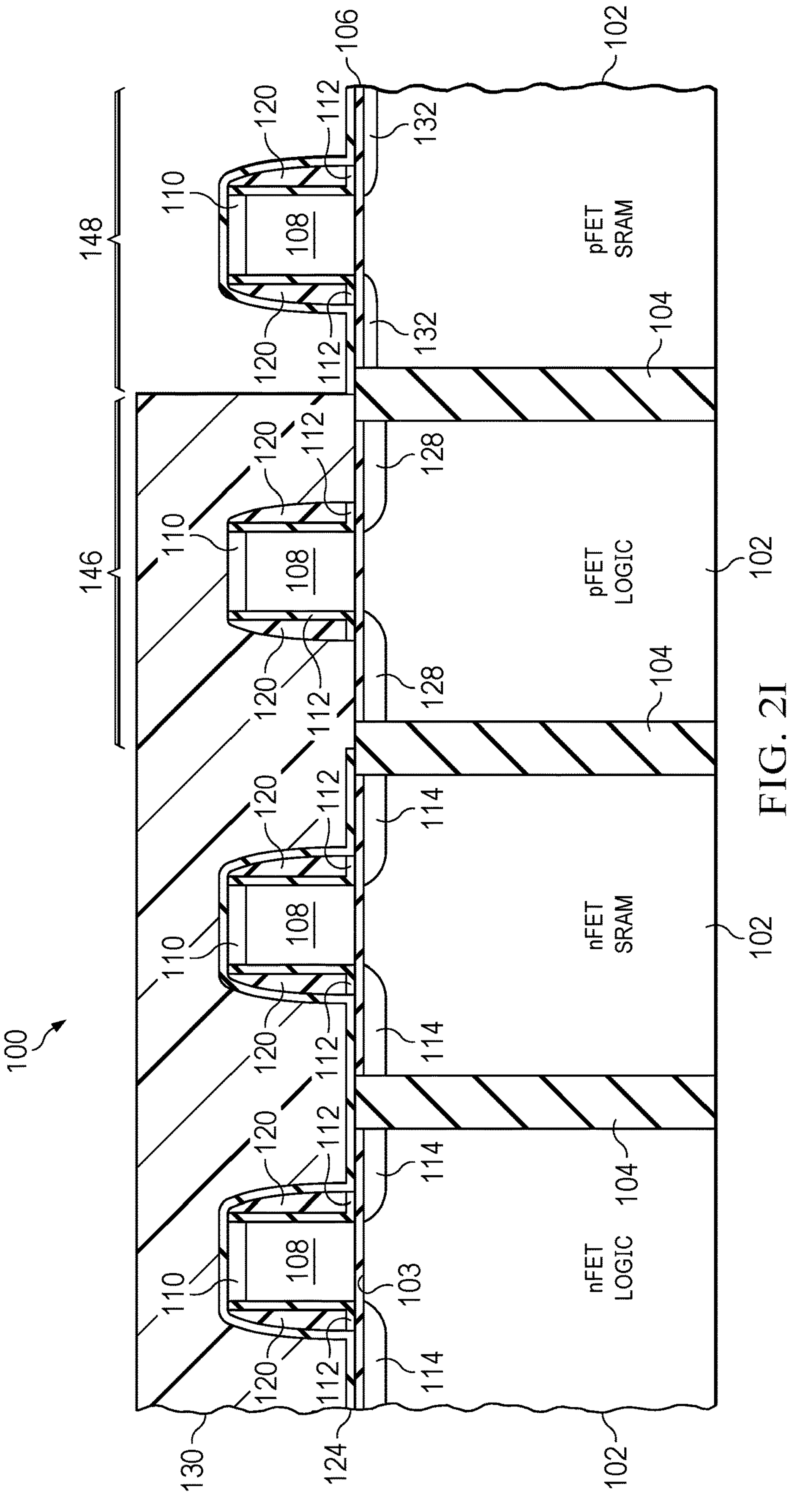

FIG. 2I shows the formation of patterned photoresist mask 130, which covers integrated circuit 100 except where p-FET structure 148 will be formed. In this example, photoresist mask 130 is then used to partially etch the exposed portion of hard mask 124. An etchant such as sulfur hexafluoride is used for selectivity to silicon nitride. As is further explained herein below, hard mask 124 may be completely or partially removed depending on the desired depth of the resulting SiGe regions in p-FET structure 148. In this example process flow of forming the relatively shallower SiGe regions in p-FET structure 148 than p-FET structure 146, the hard mask 124 over p-FET structure 148 may be thinned to have a greater thickness remaining than p-FET structure 146, but not completely removed. In addition, an ion implant process of boron or $BF_2$ having an energy of 2 to 10 keV and a dose of $1\times10^{14}$ to $1\times10^{16}$ atoms/cm$^2$ is performed to form LDD regions 132. This ion implant process may also include halo implants of phosphorus and/or arsenic with an energy of 5 to 30 keV and a dose of $1\times10^{14}$ to $1\times10^{15}$ depending on the species and other co-implanted species. The ion implant process may be done before etching the hard mask 124 or after at least partially etching the hard mask 124 depending on desired electrical characteristics of the p-FET structure 148. Subsequently, the photoresist mask 130 is removed.

Figure 5:
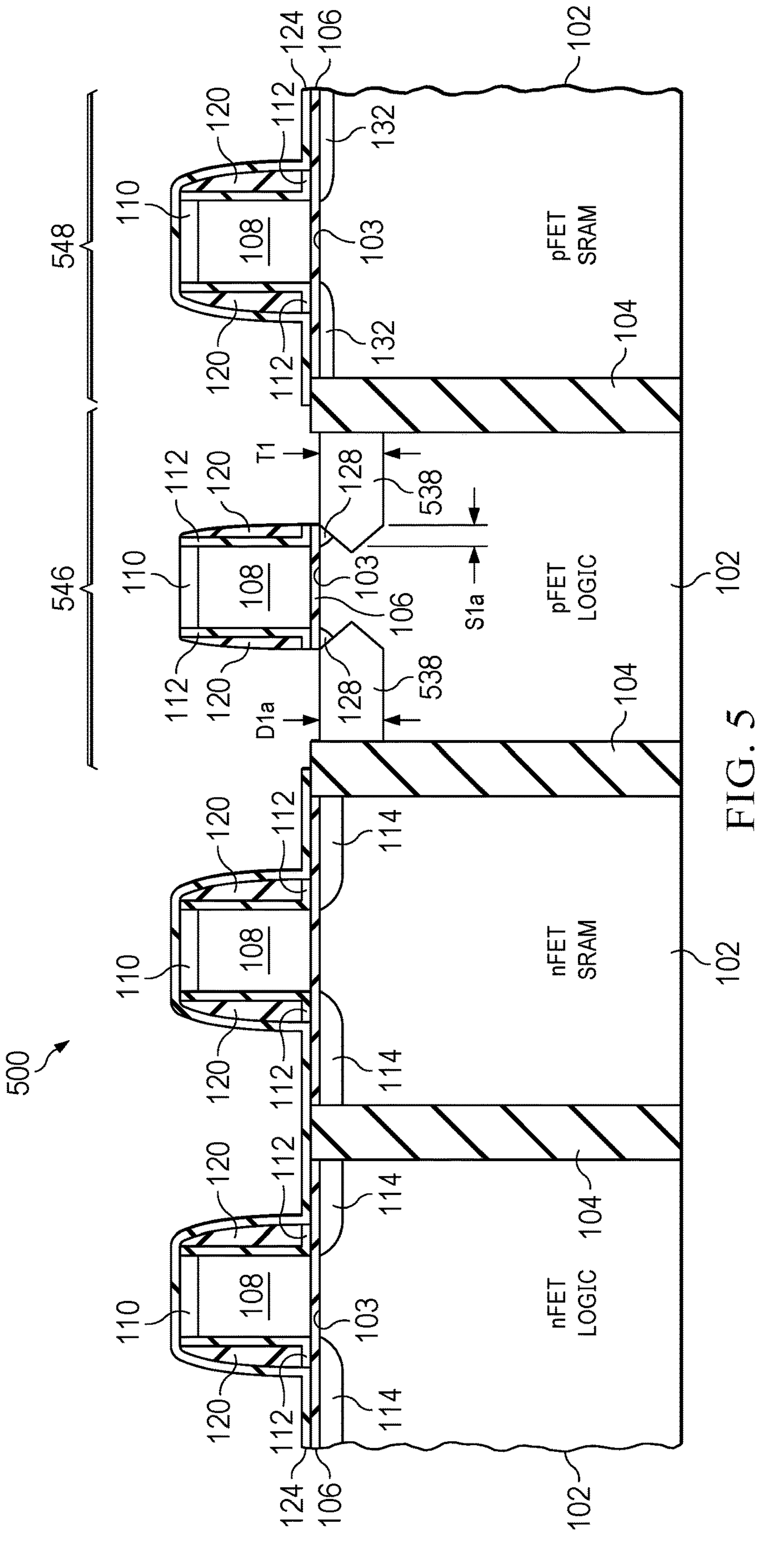
FIG. 5 is a side view of another example integrated circuit.

In some examples, even when an ion implantation process with same implant conditions (e.g., energy and dose) is used for forming the LDD regions 128 and 132, resulting LDD regions 128 and 132 may be different from each other in view of different remaining thicknesses of the hard mask 124 (e.g., over the surface 103 of the substrate 102, over the spacer 120), through which the ion implantation processes are performed—e.g., different dopant distribution in the substrate 102 with different implant projection ranges, different spacings from the edge of the gates 108). In some examples, the hard mask 124 over p-FET structure 148 may remain intact (e.g., not etched) such that the SiGe region is absent in the p-FET structure 148 as shown in FIG. 5.

Figure 2J:
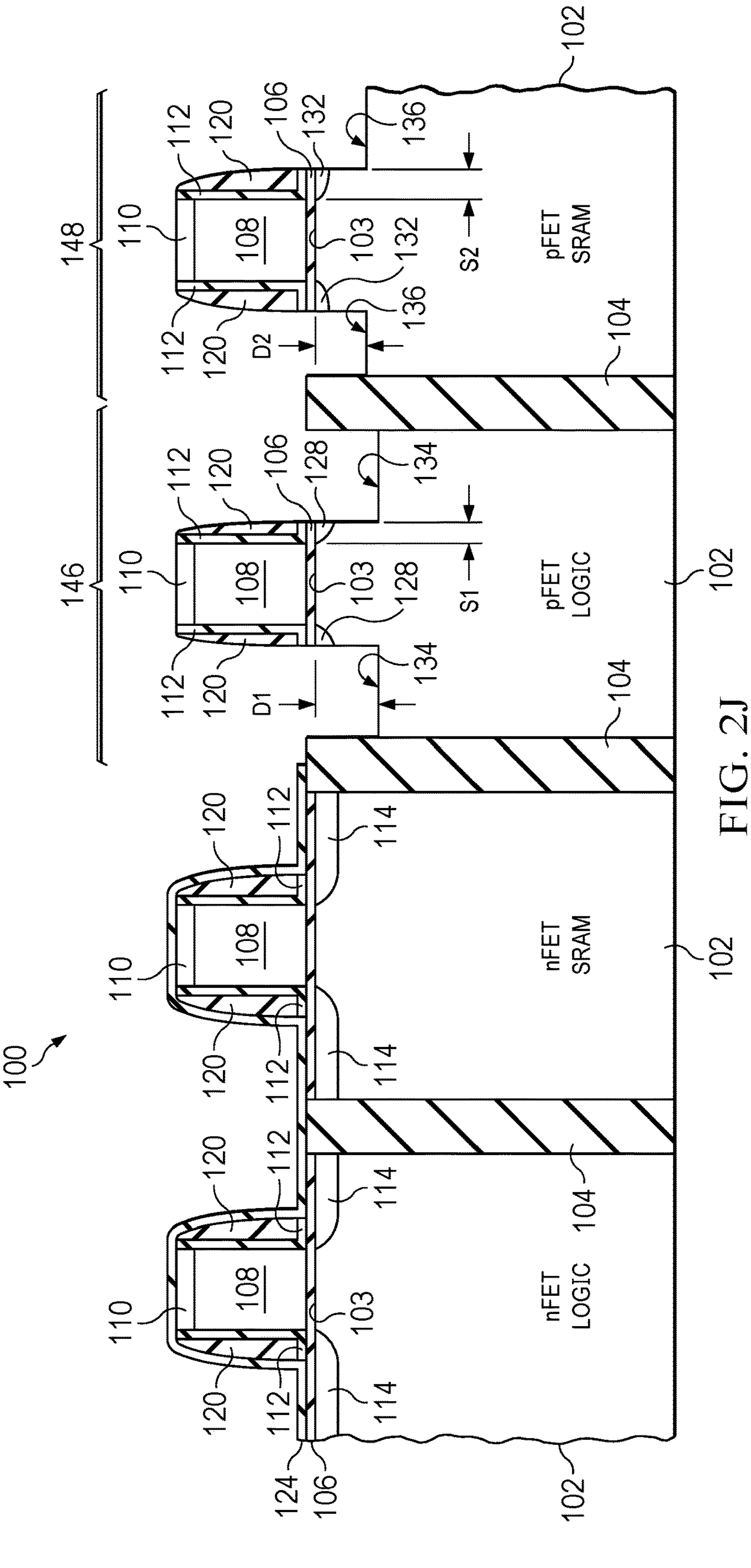

FIG. 2J shows a recess etch process for etching of substrate 102 (e.g., using a plasma enhanced etching) with an etchant selective to silicon over silicon nitride (and silicon oxide) to form cavities 134 and 136 in the substrate 102, respectively. Examples of such an etch include $H_2/CF_4$, $SF_6$ and $HBr/Cl_2$. Hard mask 124 protects most areas from this etch—e.g., the areas including n-FETs. Moreover, the spacers 120 and the gate caps 110 protect the gate structures and the corresponding channel regions for p-FET structures 146, 148. In this example implementation, the hard mask 124 over p-FET structure 148 was thinned, but not completely removed in the step of FIG. 2I as described above. Therefore, a portion of the etching time when the etchant is removing silicon to form cavities 134 will be required to remove the remaining portions of hard mask 124 before beginning to remove silicon to form cavities 136. In this manner, different cavities between two different p-FET structures can be provided without the need for additional masking and separate etching steps for forming the different cavities.

For example, a differential in the depths of cavities 134 and cavities 136 can be generated as shown in FIG. 2J, namely depth D1, is greater than depth D2 (e.g., with respect to the surface 103). In addition, because the part of the remaining hard mask 124 will be on the spacers 120 of the p-FET structure 148 (or the remaining hard mask 124 on the spacers 120 of the p-FET structure 148 is thicker than the remaining hard mask 124 on the spacers 120 of the p-FET structure 146), the lateral distance (S2) between cavities 136 and the gate 108 in the p-FET structure 148 is greater than the lateral distance (S1) between cavities 134 and the gate 108 in the p-FET structure 146—e.g., the lateral distances S1, S2 measured at a plane corresponding to the surface 103 of the substrate 102.

Figure 2K:
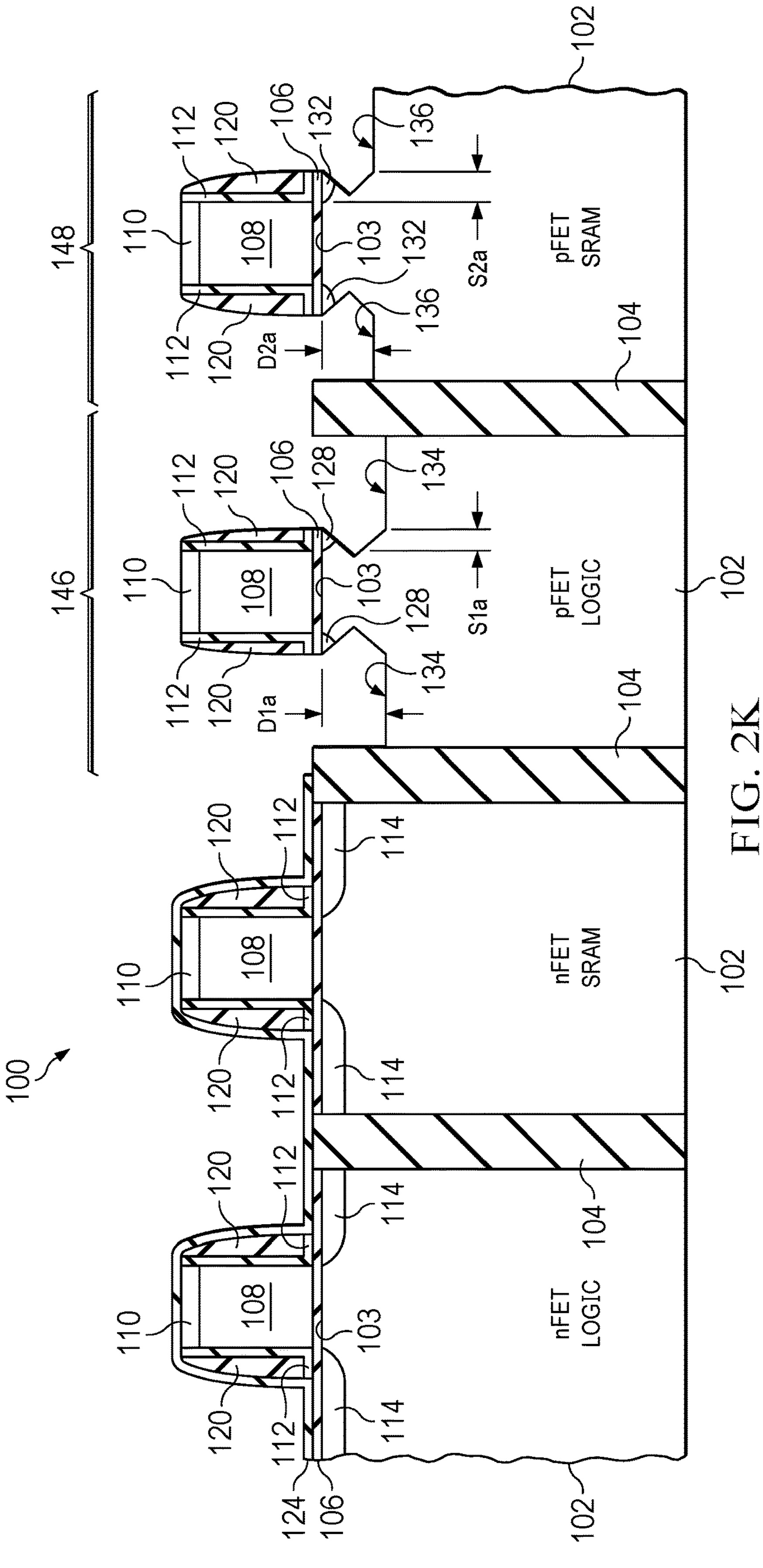

FIG. 2K shows the results of crystallographic etching in cavities 134 and cavities 136—e.g., having different etch rates based on different crystallographic surfaces exposed to the etchant. An example crystallographically oriented etchant is tetramethylammonium hydroxide (TMAH). This etching step may be used to prevent excessive stress during the epitaxy process when epitaxially depositing (forming, growing) SiGe as in the step of FIG. 2L. As a result of the crystallographic etching, although the depths D1*a*, D2*a* depicted in FIG. 2K may be different than the depths D1, D2 depicted in FIG. 2J, the depth D1*a* remains greater than D2*a*. Similarly, although the lateral distances Sla, S2*a* depicted in FIG. 2K may be different than the lateral distances S1, S2 depicted in FIG. 2J, the lateral distance S2*a* remains greater than the lateral distance Sla.

Figure 2L:
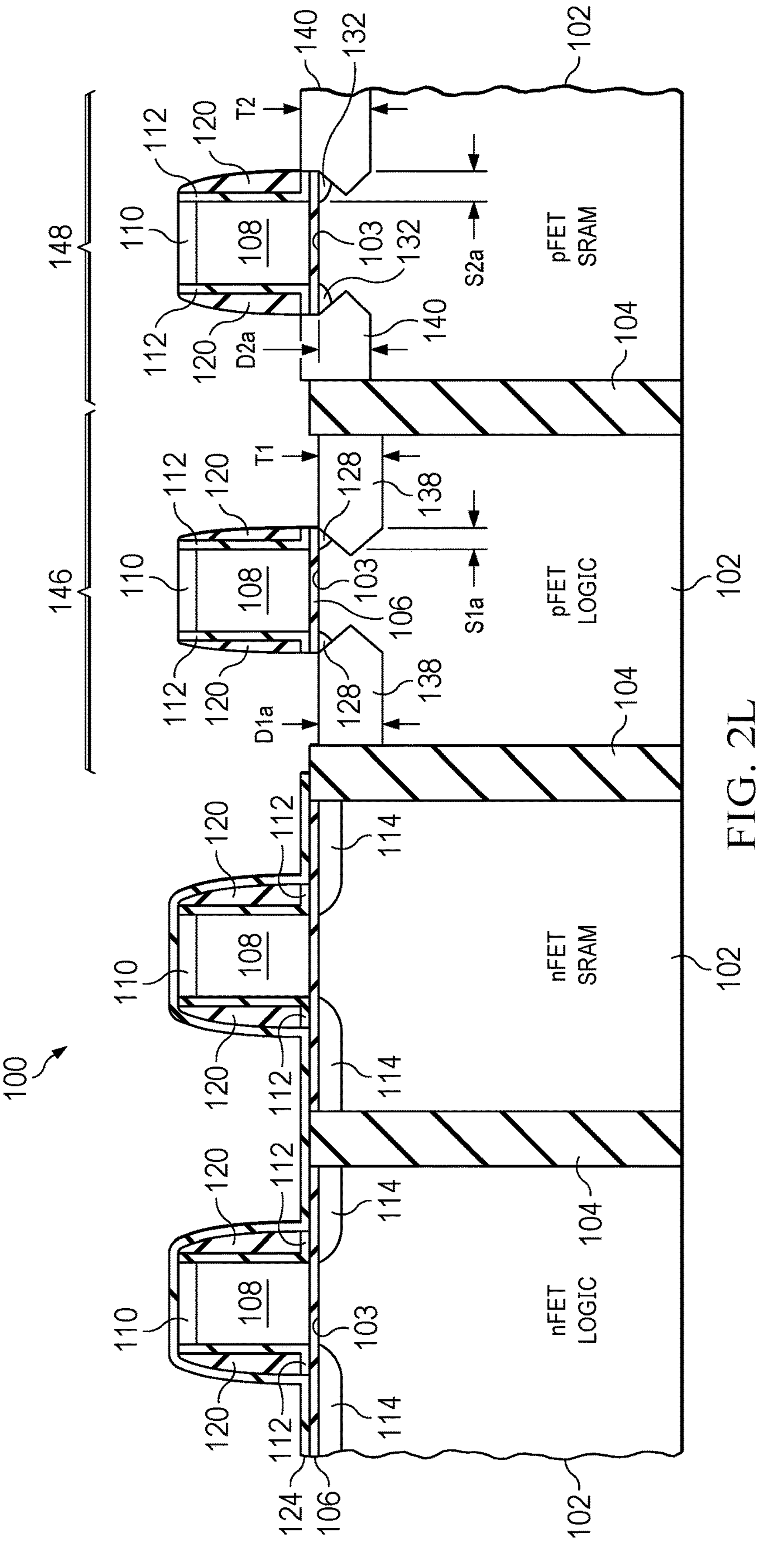

FIG. 2L shows SiGe regions 138 and SiGe regions 140 formed in cavities 134 and 136, respectively. SiGe regions 138 and SiGe regions 140 are formed concurrently using epitaxial deposition, which allows for precise control of the deposited material and its composition between the p-FET structure 146 and the p-FET structure 148. In an example, a silicon-germanium alloy of $Si_{1-x}Ge_x$, wherein x varies between 0.2 and 0.5 is deposited. In addition to silicon and germanium, boron may be included during the deposition to provide SiGe regions having the same conductivity as LDD regions 128 and LDD regions 132. Given the additional material needed to fill cavities 134 (e.g., due to its deeper recess into the substrate 102 than the cavities 136), SiGe regions 140 may extend above the top surface 103 of substrate 102. That is, the thickness T2 of SiGe regions 140 may be approximately equal to thickness T1 of SiGe regions 138. In other words, SiGe regions 140 may have a greater extension above the top surface 103 than SiGe regions 138 as a result of having a shallower depth (e.g., D2*a* being less than D1*a*).

Figure 2M:
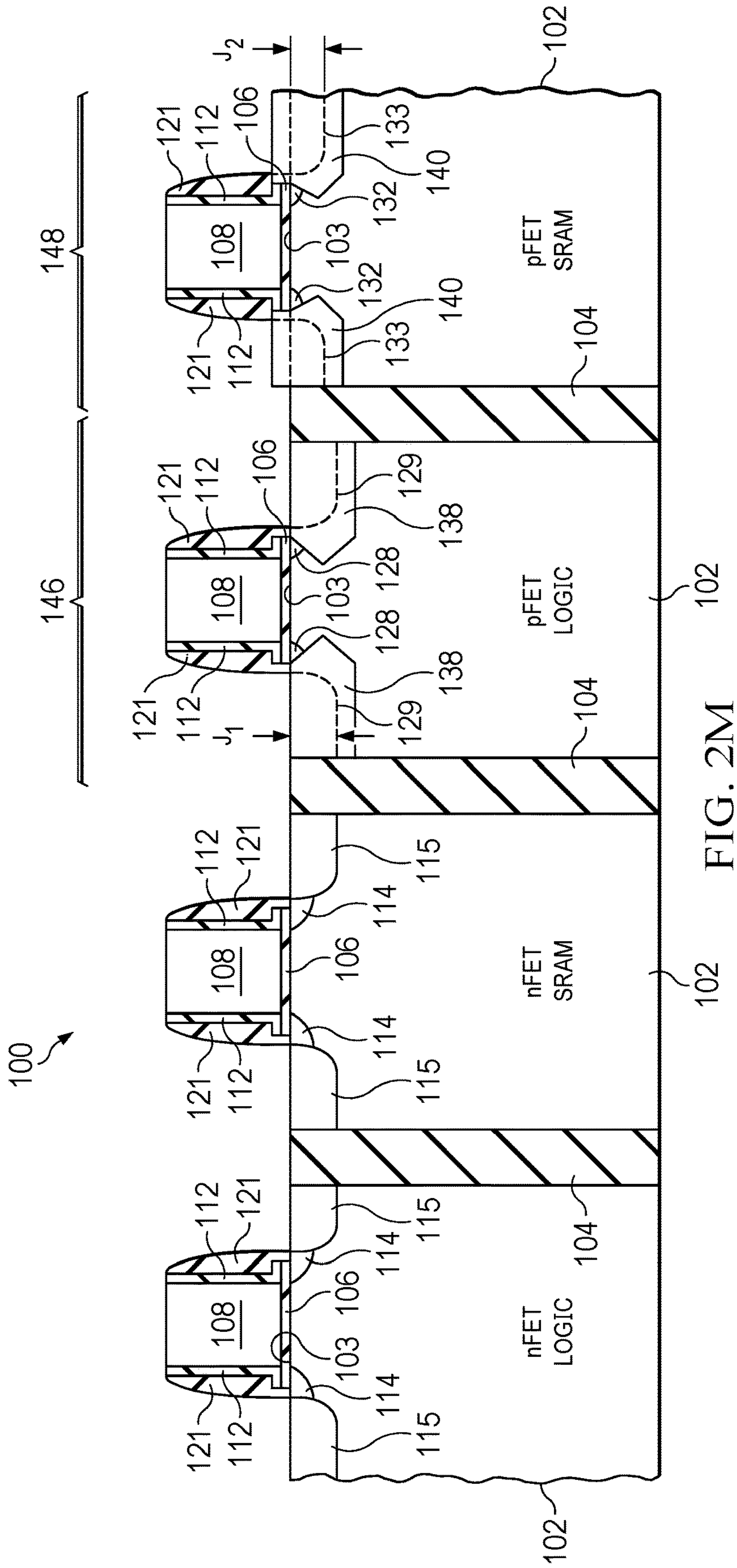

Subsequently, source/drain regions for n-FET structures and p-FET structures 146, 148 are formed. For example, FIG. 2M shows that hard mask 124 and spacers 120 have been removed using wet etching with chemistries selective to silicon nitride and silicon dioxide, respectively. In some examples, as shown in FIG. 2M, the gate caps 110 may be removed such that gates 108 may be implanted with dopants forming the source/drain regions for n-FET structures and p-FET structures 146, 148. Moreover, FIG. 2M illustrates that spacers 121 are formed (e.g., depositing a dielectric layer and anisotropically etching the dielectric layer) prior to respective source/drain implant processes for n-FET structures and p-FET structures 146, 148. The spacers 121 may have a greater base width than the spacers 120 such that the source/drain implants are distanced further away from the edge of the gates 108 than the feet of the sidewall spacers 112. One or more anneals may follow the source/drain implant processes. FIG. 2M also illustrates resulting source/drain regions 115 of the n-FET structures and respective source/drain regions 129, 133 for the p-FET structures 146, 148 shown in dotted lines. As depicted in FIG. 2M, the source/drain regions 129, 133 may be contained in the SiGe regions 138, 140, respectively.

Figure 2N:
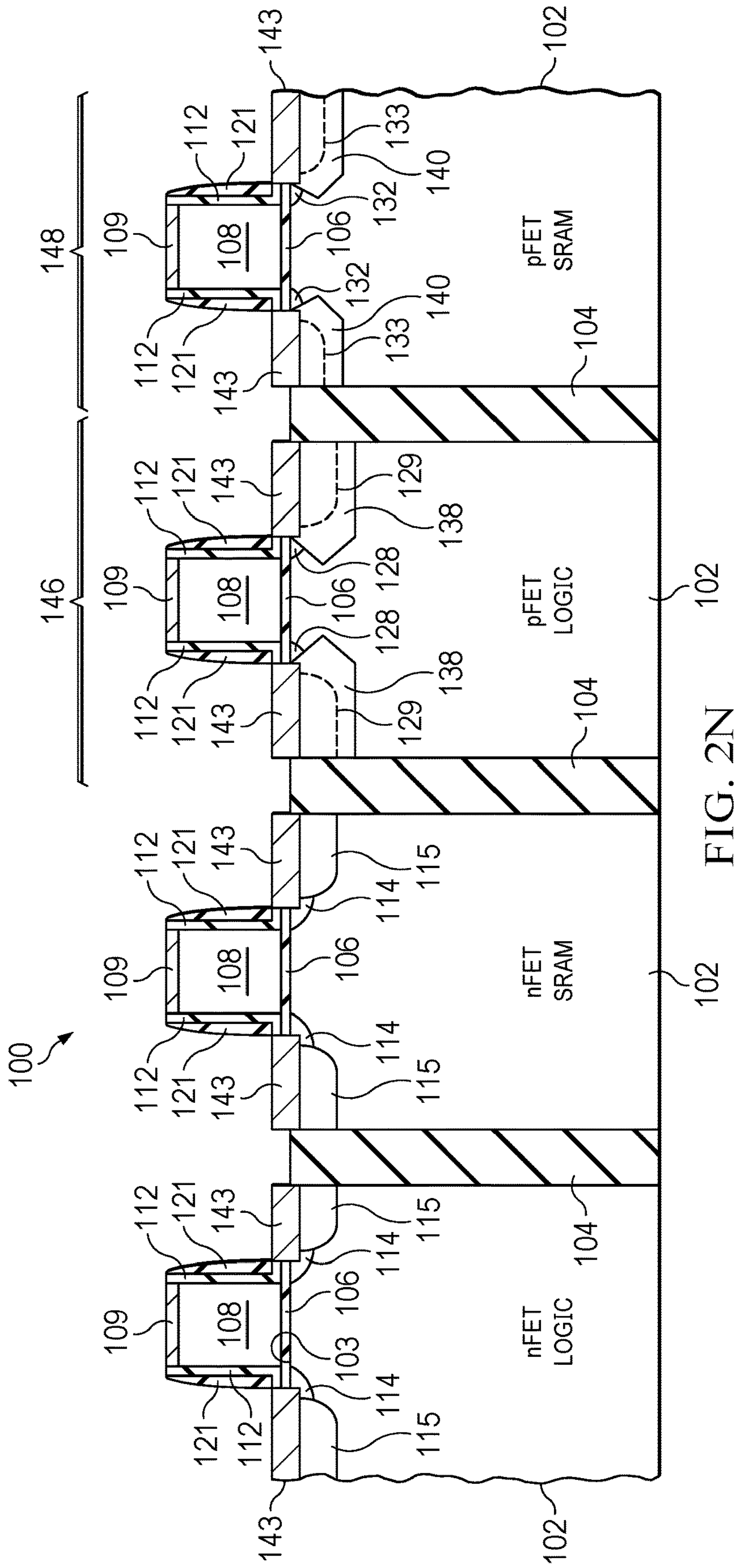

FIG. 2N illustrates the spacers 121 may be thinned and gate silicide 109 and silicide regions 143 are formed by a silicidation process. In some examples, the silicidation process includes depositing a layer of siliciding metal, such as titanium, cobalt, nickel, platinum, or molybdenum. Subsequently, an annealing process causes the siliciding metal to react with exposed silicon (e.g., in source/drain regions 114, SiGe regions 138, SiGe regions 140, and gates 108). Unreacted siliciding metal (e.g., siliciding metal deposited on spacers 121) is removed afterwards. Silicide regions 143 (and gate silicide 109) provide better conductivity to source/drain contacts 144 (and gate contacts not shown), which include a desired contact metal, such as titanium/tungsten.

Figure 2O:
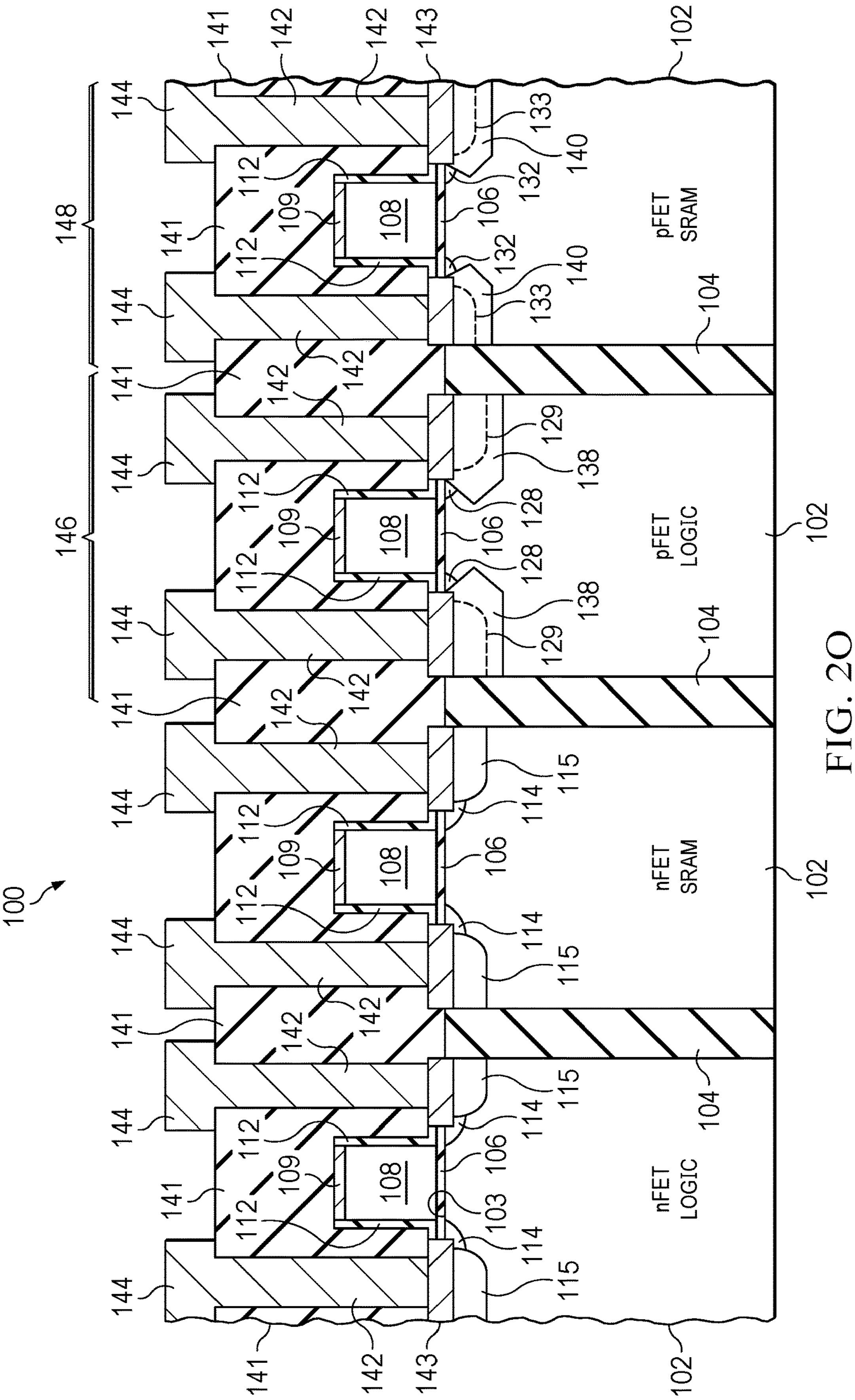

FIG. 2O illustrates that the thinned spacers 121 is removed after the silicidation process. A thin silicon nitride liner layer (not shown) followed by a pre-metal dielectric (PMD) 141 (e.g., tetraethyl orthosilicate (TEOS) deposited by CVD) is formed and planarized. Also illustrated in FIG. 2O are openings 142 etched through interlevel dielectric 141. Openings 142 are formed by reactive ion etching (RIE). Subsequently, source/drain contacts 144 (and gate contacts not shown) are formed in the openings 142, which include a desired contact metal, such as titanium/tungsten.

Figure 3:
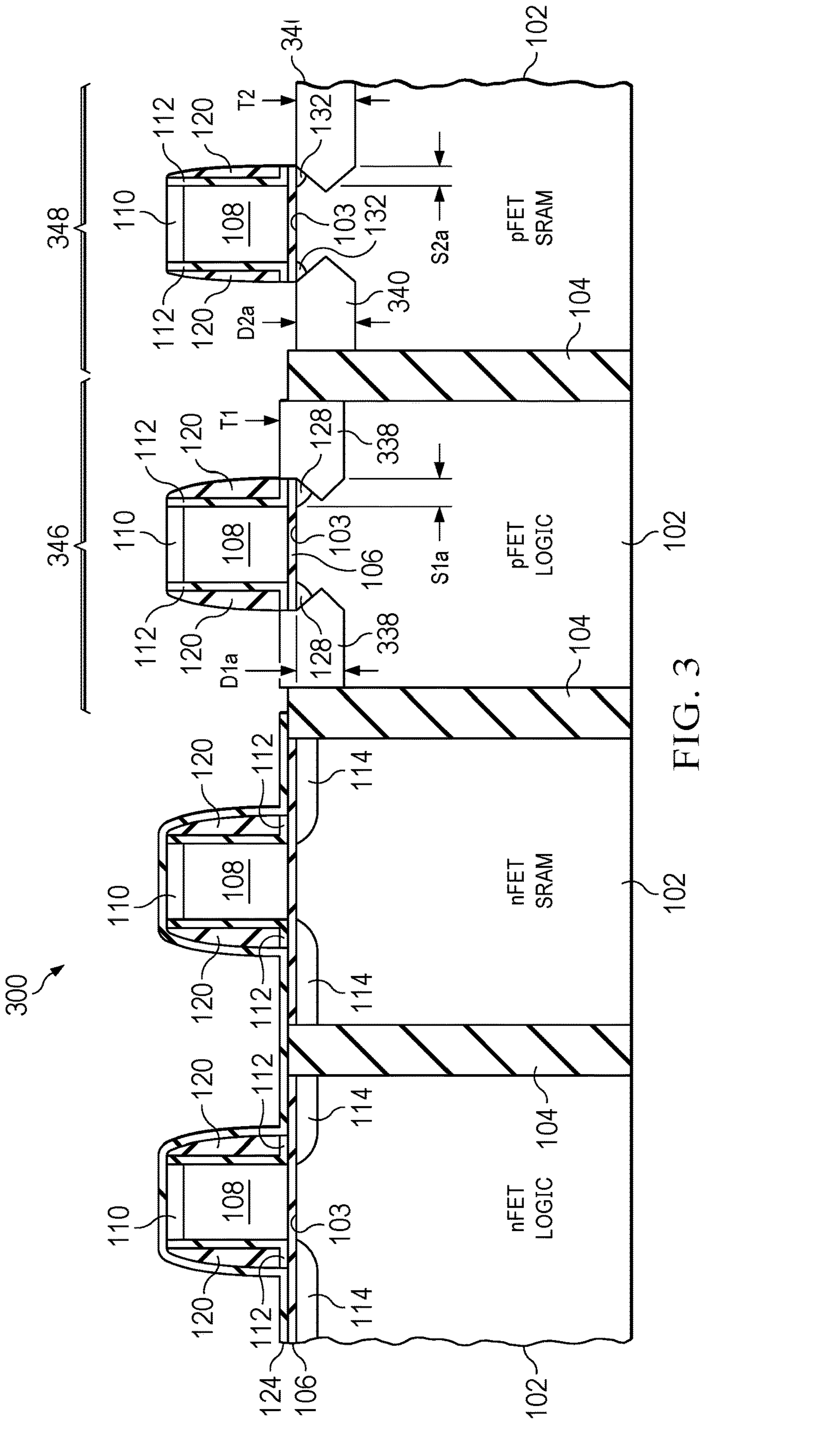
FIG. 3 is a side view of another example integrated circuit.

FIG. 3 is a side view of another example integrated circuit 300. Integrated circuit 300 is similar to integrated circuit 100 (FIG. 1), at the stage of process described with reference to FIG. 2L where SiGe regions have been formed. Contrary to the integrated circuit 100, hard mask 124 (FIG. 2G) was thinned on p-FET structure 346 and removed on p-FET structure 348 (or the hard mask 124 over p-FET structure 348 may be thinned to have a less thickness remaining than p-FET structure 346). Thus, the cavities for SiGe regions 338 extend less into the substrate 102 than the cavities for SiGe regions 340. As with the process of FIGS. 2A-O, SiGe regions 338 and SiGe regions 340 are formed in the same epitaxial deposition process. The result is that SiGe regions 338 extends less into the substrate 102 than SiGe regions 340—e.g., depth D1*a* from the surface 103 being less than depth D2*a* from the surface 103. Moreover, the lateral distance Sla is greater than the lateral distance S2*a*. Subsequently, process steps described with reference to FIGS. 2M through 2O can be carried out to complete forming the p-FET structures 346, 348.

Figure 4:
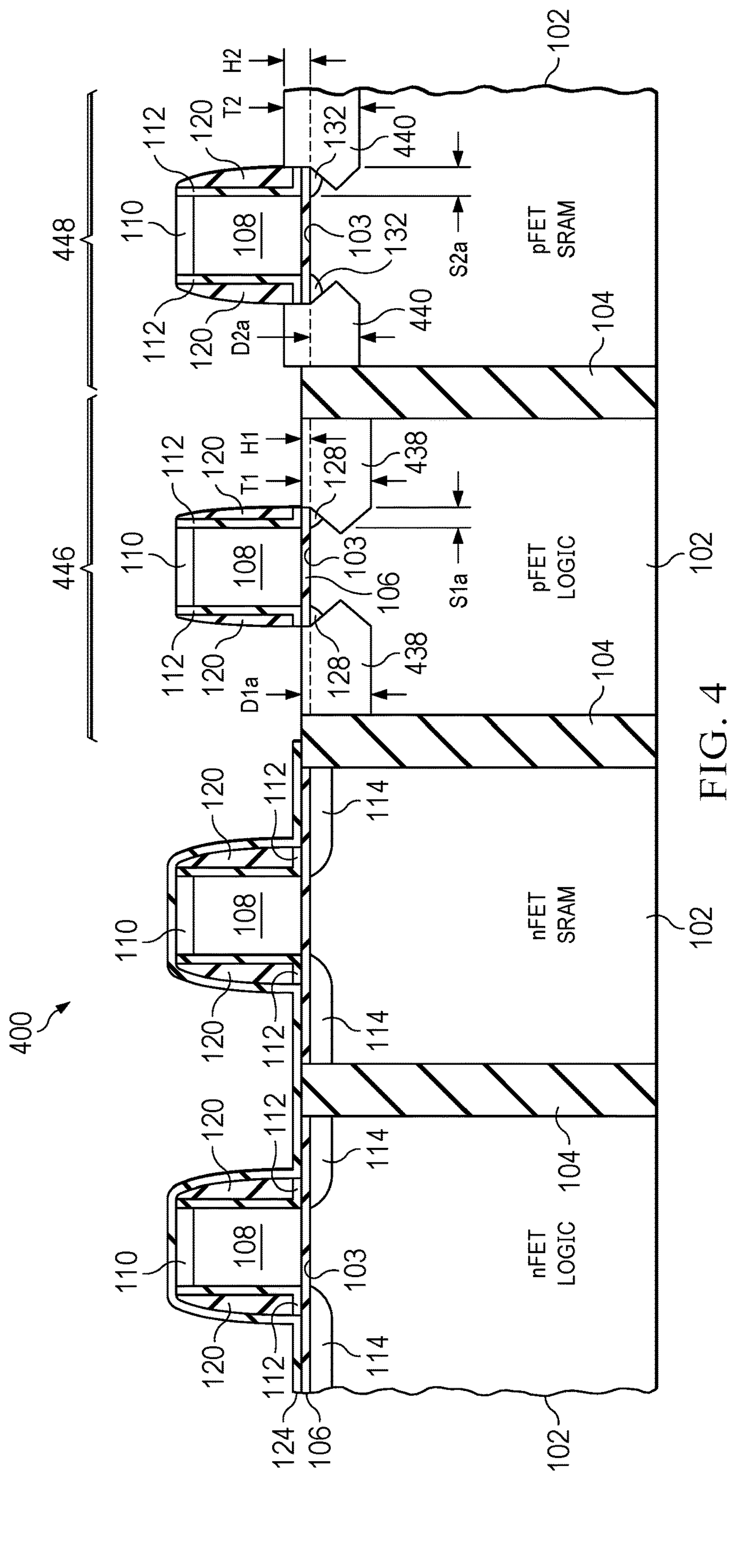
FIG. 4 is a side view of another example integrated circuit.

FIG. 4 is a side view of another example integrated circuit 400. Integrated circuit 400 is similar to integrated circuit 100 (FIG. 1), at the stage of process described with reference to FIG. 2L where SiGe regions have been formed. As with the integrated circuit 100, hard mask 124 (FIG. 2G) was thinned on p-FET SRAM 448 and removed on p-FET logic 446 (or the hard mask 124 over p-FET structure 446 may be thinned to have a less thickness remaining than p-FET structure 448). Thus, the cavities for SiGe regions 440 extend less into the substrate 102 than the cavities for SiGe regions 438—e.g., depth D1*a* from the surface 103 being greater than depth D2*a* from the surface 103. As with the process of FIGS. 2A-O, SiGe regions 438 and SiGe regions 440 are formed in the same epitaxial deposition process. However, the epitaxial deposition process for integrated circuit 400 is extended so that SiGe regions 438, 440 extend above the surface 103 of substrate 102—e.g., the heights H1, H2 with respect to the surface 103 as denoted in FIG. 4. In other words, SiGe regions 440 may extend more above the surface 103 of substrate 102 than SiGe regions 438—e.g., the height H2 of SiGe regions 440 being greater than the corresponding height H1 of the SiGe regions 438 (which may be zero in some cases). In some examples, the SiGe regions protruded above the surface 103 may be beneficial to have subsequently formed source/drain regions of p-FET structures to have shallower junction depths with respect to the surface 103, thus mitigating leakage in the p-FET structures. Subsequently, process steps described with reference to FIGS. 2M through 2O can be carried out to complete forming the p-FET structures 446, 448.

Thus, as shown in FIGS. 2-4, by modulating the thickness of hard mask 124 (FIG. 2G) where SiGe regions are to be formed, control over the relative structural features (e.g., depths extended into the substrate, lateral distances from the gate edge, protruded portions above a surface of the substrate) of the resulting SiGe is achieved without additional photolithographic masking.

FIG. 5 is a side view of another example integrated circuit 500. Integrated circuit 500 is similar to integrated circuit 100 (FIG. 1) at the stage of process described with reference to FIG. 2L where SiGe regions have been formed. Contrary to the integrated circuit 100, hard mask 124 (FIG. 2G) was removed (or thinned) on p-FET structure 546, but remained intact on p-FET structure 548. Thus, while the cavities and corresponding SiGe regions 538 are formed for p-FET structure 546, the hard mask 124 protects p-FET structure 548. As a result, p-FET structure 546 lacks SiGe regions. Subsequently, process steps described with reference to FIGS. 2M through 20 can be carried out to complete forming the p-FET structures 546, 548.

Modifications are possible in the described examples, and other examples are possible, within the scope of the claims. For example, although above-described examples are based on forming SiGe regions for p-FETs, the present disclosure is not limited thereto. In some examples, the method described herein may be utilized to form SiC regions having different structural features for different n-FET structures—e.g., n-FETs for logic operations, n-FETs for SRAM.

What is claimed is:

1. A semiconductor device, comprising:
- a first p-channel field effect transistor (p-FET) including:
  - a first gate dielectric layer on a surface of a substrate;
  - a first gate structure on the first gate dielectric layer;
  - first silicon-germanium (SiGe) regions disposed in the substrate, on both sides of the first gate structure; and
  - first lightly-doped drain (LDD) regions laterally extended between the first SiGe regions and the first gate structure; and
- a second p-FET including:
  - a second gate dielectric layer on the surface of the substrate;
  - a second gate structure on the second gate dielectric layer;
  - second SiGe regions disposed in the substrate, on both sides of the second gate structure; and
  - second lightly-doped drain (LDD) regions laterally extended between the second SiGe regions and the second gate structure, the second LDD regions being different than the first LDD regions.

2. The semiconductor device of claim 1, wherein:
- the first SiGe regions are laterally spaced away from respective sidewalls of the first gate structure by a first distance; and
- the second SiGe regions are laterally spaced away from respective sidewalls of the second gate structure by a second distance different than the first distance.

3. The semiconductor device of claim 1, wherein:
- the first SiGe regions include first portions extended to a first height from the surface of the substrate; and
- the second SiGe regions include second portions extended to a second height from the surface of the substrate, the second height being different than the first height.

4. The semiconductor device of claim 1, wherein the first SiGe regions and the second SiGe regions are concurrently formed.

5. The semiconductor device of claim 1, further comprising:
- a source region and a drain region of the first p-FET disposed in the respective first SiGe regions; and
- a source region and a drain region of the second p-FET disposed in the respective second SiGe regions.

6. The semiconductor device of claim 1, further comprising:
- first silicide regions disposed on the first SiGe regions; and
- second silicide regions disposed on the second SiGe regions.

7. The semiconductor device of claim 1, wherein the first gate dielectric layer and the second gate dielectric layer are concurrently formed.

8. The semiconductor device of claim 1, wherein the first SiGe regions and the second SiGe regions include a silicon-germanium alloy of $Si_{1-x}Ge_x$, wherein x varies between 0.2 and 0.5.

9. The semiconductor device of claim 1, wherein at least one of the first gate dielectric layer and the second gate dielectric layer includes a high-k dielectric material having a dielectric constant greater than silicon dioxide ($SiO_2$).

10. The semiconductor device of claim 1, further comprising:
- an n-channel field effect transistor (n-FET) in the substrate, the n-FET being exclusive of a SiGe region.

11. A method, comprising:
- depositing a hard mask over a first p-channel field effect transistor (p-FET) structure in a first region of a substrate and a second p-FET structure in a second region of the substrate, wherein—
- the first p-FET structure includes:
  - a first gate dielectric layer on a surface of the substrate;
  - a first gate structure on the first gate dielectric layer;
  - first spacers formed on sidewalls of the first gate structure; and
  - first source/drain areas of the substrate, on both sides of the first gate structure; and
- the second p-FET structure includes:
  - a second gate dielectric layer on the surface of the substrate;
  - a second gate structure on the second gate dielectric layer;

second spacers formed on sidewalls of the second gate structure; and second source/drain areas of the substrate, on both sides of the second gate structure;

forming a first patterned photoresist mask that uncovers the first region to expose the first p-FET structure while covering the second region;

performing a first etch process after forming the first patterned photoresist mask, the first etch process configured to remove at least a portion of the hard mask over the first p-FET structure;

removing the first patterned photoresist mask;

forming a second patterned photoresist mask that uncovers the second region to expose the second p-FET structure while covering the first region; and performing a second etch process after forming the second patterned photoresist mask, the second etch process configured to remove at least a portion of the hard mask over the second p-FET structure, the second etch process different than the first etch process.

12. The method of claim 11, further comprising:

performing a first implant process, after forming the first patterned photoresist mask and before performing the first etch process, the first implant process configured to form first lightly-doped drain (LDD) regions in the first source/drain areas.

13. The method of claim 12, further comprising:

performing a first implant process, after forming the first patterned photoresist mask and after performing the first etch process, the first implant process configured to form first lightly-doped drain (LDD) regions in the first source/drain areas.

14. The method of claim 12, further comprising:

performing a second implant process, after forming the second patterned photoresist mask and before performing the second etch process, the second implant process configured to form second lightly-doped drain (LDD) regions in the second source/drain areas.

15. The method of claim 12, further comprising:

performing a second implant process, after forming the second patterned photoresist mask and after performing the second etch process, the second implant process configured to form second lightly-doped drain (LDD) regions in the second source/drain areas.

16. The method of claim 11, wherein:

the first source/drain areas have a first thickness of the hard mask remaining as a result of performing the first etch process; and the second source/drain areas have a second thickness of the hard mask remaining as a result of performing the second etch process, the second thickness different than the first thickness.

17. The method of claim 11, wherein:

the first spacers have a first width proximate the surface of the substrate as a result of performing the first etch process; and the second spacers have a second width proximate the surface of the substrate as a result of performing the second etch process, the second width different than the first width.

18. The method of claim 11, further comprising:

removing the second patterned photoresist mask; and performing a recess etch process configured to generate:

first cavities in the first source/drain areas, the first cavities having a first depth from the surface of the substrate, and second cavities in the second source/drain areas, the second cavities having a second depth from the surface of the substrate, the second depth being different than the first depth.

19. The method of claim 18, wherein the second depth is different than the first depth at least partially due to the first etch process being different than the first etch process.

20. The method of claim 18, further comprising:

performing an epitaxy process that selectively forms first silicon-germanium (SiGe) regions in the first cavities and second SiGe regions in the second cavities.

21. The method of claim 20, wherein:

the first SiGe regions are laterally spaced away from respective sidewalls of the first gate structure by a first distance; and the second SiGe regions are laterally spaced away from respective sidewalls of the second gate structure by a second distance different than the first distance.

22. The method of claim 20, wherein:

the first SiGe regions include first portions extended to a first height from the surface of the substrate; and the second SiGe regions include second portions extended to a second height from the surface of the substrate, the second height being different than the first height.

23. The method of claim 20, further comprising:

removing the first spacers and the second spacers after performing the epitaxy process;

forming third spacers on sidewalls of the first and second gate structures; and performing a third implant process configured to form:

a source region and a drain region of the first p-FET structure in the respective first SiGe regions; and a source region and a drain region of the second p-FET structure in the respective second SiGe regions.

24. The method of claim 23, further comprising:

performing a third etch process configured to reduce a width of the third spacers proximate the surface of the substrate; and performing a silicidation process configured to form first silicide regions on the first SiGe regions and second silicide regions on the second SiGe regions.

25. The semiconductor device of claim 1, wherein:

the first SiGe regions extended to a first depth from the surface of the substrate; and the second SiGe regions extended to a second depth from the surface of the substrate, the second depth different than the first depth.

* * * * *